(12) United States Patent
Kilchyk et al.

(10) Patent No.: US 12,384,515 B2
(45) Date of Patent: Aug. 12, 2025

(54) AIRFOIL FORMED OF THERMALLY ADAPTIVE MATERIALS AND A THERMOELECTRIC JUNCTION

(71) Applicant: Hamilton Sundstrand Corporation, Charlotte, NC (US)

(72) Inventors: Viktor Kilchyk, Lancaster, NY (US); Brent J. Merritt, Southwick, MA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 18/464,159

(22) Filed: Sep. 8, 2023

(65) Prior Publication Data
US 2025/0083795 A1    Mar. 13, 2025

(51) Int. Cl.
*B64C 3/48* (2006.01)
*B64C 3/14* (2006.01)
*H10N 10/17* (2023.01)

(52) U.S. Cl.
CPC .......... *B64C 3/48* (2013.01); *B64C 3/14* (2013.01); *H10N 10/17* (2023.02)

(58) Field of Classification Search
CPC ...... B64C 3/48; B64C 2003/445; H10N 10/17
See application file for complete search history.

(56) References Cited

U.S. PATENT DOCUMENTS

| | | | |
|---|---|---|---|
| 3,326,726 A * | 6/1967 | Bassett, Jr. | ............ H10N 10/17 136/203 |
| 4,327,154 A | 4/1982 | Rossmann | |
| 4,851,285 A * | 7/1989 | Brotz | ....................... G21H 1/06 976/DIG. 413 |
| 4,939,038 A | 7/1990 | Inabata | |
| 5,230,850 A | 7/1993 | Lewis | |
| 5,634,189 A * | 5/1997 | Rossmann | ................ F01D 5/28 428/548 |
| 6,100,463 A | 8/2000 | Ladd et al. | |
| 6,161,382 A | 12/2000 | Brotz | |
| 6,182,929 B1 | 2/2001 | Martin et al. | |
| 7,037,076 B2 | 5/2006 | Jacot et al. | |

(Continued)

FOREIGN PATENT DOCUMENTS

| DE | 10250758 A1 | 5/2004 |
|---|---|---|
| DE | 102014225229 A1 | 6/2016 |

(Continued)

OTHER PUBLICATIONS

Niccolo Giani, Towards sustainability in 3D printing of thermoplastic composites: Evaluation of recycled carbon fibers as reinforcing agent for FDM filament production and 3D printing, May 19, 2022, elsavier compoites part A 159 (2022) 107002 (Year: 2022).*

(Continued)

*Primary Examiner* — Brian M O'Hara
(74) *Attorney, Agent, or Firm* — CANTOR COLBURN LLP

(57) ABSTRACT

An airfoil having: a composition gradient defining a first coefficient of thermal expansion and a second coefficient of thermal expansion that differs from the first coefficient of thermal expansion; and a thermoelectric junction operationally coupled to the composition gradient, wherein the composition gradient is formed of either of a plurality of dissimilar metals or of plastic with fillings or fibers.

10 Claims, 11 Drawing Sheets

(56) References Cited

U.S. PATENT DOCUMENTS

| | | | |
|---|---|---|---|
| 7,147,269 B2 | 12/2006 | Aase et al. | |
| 7,650,910 B2 | 1/2010 | Welle | |
| 7,686,040 B2 | 3/2010 | Welle | |
| 7,721,762 B2 | 5/2010 | Welle | |
| 7,753,654 B2* | 7/2010 | Read | F02C 7/045 |
| | | | 416/500 |
| 7,770,959 B2 | 8/2010 | Browne et al. | |
| 7,854,467 B2 | 12/2010 | Mcknight et al. | |
| 7,922,456 B2* | 4/2011 | McMillan | F01D 5/147 |
| | | | 416/232 |
| 7,967,568 B2 | 6/2011 | Dalton et al. | |
| 8,119,206 B2 | 2/2012 | Hougham et al. | |
| 9,181,933 B2 | 11/2015 | Daly et al. | |
| 9,719,536 B2* | 8/2017 | Ashmawi | F16B 2/08 |
| 9,752,442 B2 | 9/2017 | Hayford et al. | |
| 9,784,126 B2 | 10/2017 | Army et al. | |
| 9,897,078 B2 | 2/2018 | Nicholson et al. | |
| 9,919,470 B2 | 3/2018 | Behl et al. | |
| 9,981,421 B2 | 5/2018 | Marcoe et al. | |
| 10,053,239 B2* | 8/2018 | Mabe | B32B 3/28 |
| 10,543,897 B2* | 1/2020 | Brown | B64C 3/185 |
| 10,731,666 B2 | 8/2020 | Skertic | |
| 10,815,976 B2 | 10/2020 | Kaneko et al. | |
| 10,976,119 B2 | 4/2021 | Veto et al. | |
| 10,982,783 B2 | 4/2021 | Srinivasa Murthy | |
| 11,008,943 B2 | 5/2021 | Tajiri et al. | |
| 11,110,647 B2 | 9/2021 | Marcoe et al. | |
| 11,167,836 B2 | 11/2021 | Hethcock, Jr. | |
| 11,192,333 B2 | 12/2021 | Hahnlen | |
| 11,248,592 B1 | 2/2022 | Tsuruta et al. | |
| 11,268,520 B2 | 3/2022 | Melo et al. | |
| 11,359,287 B2 | 6/2022 | Philibert | |
| 11,655,346 B2 | 5/2023 | Jackson et al. | |
| 11,668,316 B1* | 6/2023 | Kilchyk | B22F 10/28 |
| | | | 416/185 |
| 12,162,606 B1* | 12/2024 | Merritt | B33Y 80/00 |
| 2001/0008357 A1 | 7/2001 | Dhuler et al. | |
| 2007/0140862 A1 | 6/2007 | Mcmillan | |
| 2007/0171257 A1 | 7/2007 | Yang | |
| 2007/0184238 A1 | 8/2007 | Hockaday et al. | |
| 2008/0236668 A1 | 10/2008 | Beerling et al. | |
| 2008/0302024 A1 | 12/2008 | Browne et al. | |
| 2010/0028205 A1 | 2/2010 | Ponjee et al. | |
| 2010/0304063 A1 | 12/2010 | McCrea et al. | |
| 2011/0284645 A1 | 11/2011 | Tiliakos et al. | |
| 2012/0255278 A1 | 10/2012 | Miao et al. | |
| 2013/0048135 A1 | 2/2013 | Blumenthal et al. | |
| 2013/0255796 A1 | 10/2013 | Dimascio et al. | |
| 2013/0255815 A1 | 10/2013 | Brinkmann et al. | |
| 2013/0287555 A1* | 10/2013 | Rosen | F04D 29/0513 |
| | | | 415/182.1 |
| 2014/0186161 A1 | 7/2014 | Colson et al. | |
| 2015/0033730 A1 | 2/2015 | Beers et al. | |
| 2015/0239046 A1 | 8/2015 | McMahan et al. | |
| 2016/0025078 A1 | 1/2016 | Li et al. | |
| 2016/0160353 A1 | 6/2016 | Miarecki et al. | |
| 2016/0186575 A1 | 6/2016 | Lacy et al. | |
| 2017/0001263 A1 | 1/2017 | Steiner | |
| 2017/0227019 A1 | 8/2017 | Chen et al. | |
| 2018/0038513 A1 | 2/2018 | Baldea et al. | |
| 2018/0043660 A1 | 2/2018 | Kang et al. | |
| 2018/0058429 A1* | 3/2018 | Kwon | H10N 19/101 |
| 2019/0203039 A1 | 7/2019 | Seo et al. | |
| 2019/0210111 A1* | 7/2019 | Army et al. | B22F 5/009 |
| | | | 244/1 |
| 2020/0009826 A1 | 1/2020 | Brown et al. | |
| 2020/0316684 A1 | 10/2020 | Shuck | |
| 2021/0020263 A1 | 1/2021 | Pasini et al. | |
| 2021/0071020 A1 | 3/2021 | Hu | |
| 2021/0085856 A1 | 3/2021 | Ding | |
| 2021/0229350 A1 | 7/2021 | Chaffins et al. | |
| 2021/0238748 A1 | 8/2021 | Andreatta | |
| 2021/0277937 A1 | 9/2021 | Elbibary et al. | |
| 2021/0372286 A1 | 12/2021 | Chakrabarti et al. | |
| 2022/0034592 A1 | 2/2022 | Maynard et al. | |
| 2022/0089799 A1 | 3/2022 | Wang et al. | |
| 2023/0080512 A1 | 3/2023 | Merritt et al. | |
| 2023/0085189 A1 | 3/2023 | Merritt et al. | |
| 2023/0142146 A1 | 5/2023 | Kilchyk | |
| 2023/0227680 A1 | 7/2023 | Hu | |
| 2025/0033270 A1 | 1/2025 | Merritt et al. | |
| 2025/0033271 A1 | 1/2025 | Merritt et al. | |
| 2025/0033272 A1 | 1/2025 | Merritt et al. | |
| 2025/0033282 A1 | 1/2025 | Merritt et al. | |
| 2025/0033283 A1 | 1/2025 | Merritt et al. | |
| 2025/0033796 A1 | 1/2025 | Merritt et al. | |
| 2025/0084766 A1 | 3/2025 | Kilchyk et al. | |
| 2025/0084833 A1 | 3/2025 | Kilchyk et al. | |
| 2025/0084834 A1 | 3/2025 | Kilchyk et al. | |
| 2025/0084859 A1 | 3/2025 | Kilchyk et al. | |
| 2025/0085725 A1 | 3/2025 | Kilchyk et al. | |
| 2025/0088125 A1 | 3/2025 | Kilchyk et al. | |
| 2025/0089567 A1 | 3/2025 | Kilchyk et al. | |
| 2025/0089568 A1 | 3/2025 | Kilchyk et al. | |

FOREIGN PATENT DOCUMENTS

| | | | | |
|---|---|---|---|---|
| EP | 2025777 A2 | 2/2009 | | |
| EP | 2974954 A1 | 1/2016 | | |
| EP | 2960497 B1 | 12/2016 | | |
| EP | 4177440 A1 | 5/2023 | | |
| EP | 4209681 A1 | 7/2023 | | |
| EP | 4219959 A2 | 8/2023 | | |
| EP | 4411108 A2 | 8/2024 | | |
| GB | 2472053 A | 1/2011 | | |
| JP | 2007023361 A | 2/2007 | | |
| JP | 2011148037 A | 8/2011 | | |
| KR | 20130005989 A | 1/2013 | | |
| WO | 2015006438 A1 | 1/2015 | | |
| WO | WO-2018108908 A1 * | 6/2018 | | H01F 7/1638 |
| WO | 2019108203 A1 | 6/2019 | | |
| WO | 2019162754 A1 | 8/2019 | | |

OTHER PUBLICATIONS

Loredana Tammaro, Reinforcing Efficiency of Recycled Carbon Fiber PLA Filament Suitable for Additive Manufacturing, Jul. 23, 2024, Polymers 2024, 16, 2100 (Year: 2024).*

Kim, Daejong, "Parametric Studies on Static and Dynamic Performance of Air Foil Bearings with Different Top Foil Geometries and Bump Stiffness Distributions", https://doi.org/10.1115/1.2540065; Published Online: Nov. 15, 2006, 9 pages.

Lim, Teik-Cheng "Metamaterial with sign-toggling thermal expansivity inspired by Islamic motifs in Spain", Journal of Science: Advanced Materials and Devices, vol. 7, No. 1, Mar. 2022, 6 pages.

Micalizz, et al., "Shape-memory actuators manufacturing by dual extrusion multimaterial 3d printing of conductive and non-conductive filaments", Smart Mater. Struct. 28, 2019, pp. 1-13.

Schmiedeke, et al. "Experimental Investigation of Two Switching States of an Active Foil Bearing during Start-Up", Machines 2022, Published Jun. 6, 2022, 18 pages.

Wei, et al., "An overview of laser-based multiple metallic material additive manufacturing: from macro-to micro-scales", International Journal of Extrem. Manuf. 3 (2021), pp. 1-33.

Markforged "Onyx FR-A and Carbon Fiber FR-A: Aerospace-Ready Materials", markforged.com, Jul. 26, 2021, pp. 1-6.

Noughabi et al., "Detailed Design and Aerodynamic Performance Analysis of a Radial-Inflow Turbine", Applied Sciences, 2018, pp. 1-21.

Pearson et al., "Novel polyurethane elastomeric composites reinforced with alumina, aramid, and poly (p-phenylene-2, 6-benzobisoxazole) short fibers, development and characterization of the thermal and dynamic mechanical properties", Composites Part B: Engineering 122 (2017): 192-201.

Zhan et al., "Metal-plastic hybrid 3D printing using catalyst-loaded filament and electroless plating", Additive Manufacturing, 2020, pp. 1-7.

Zhiguo et al., "Determination of thermal expansion coefficients for unidirectional fiber-reinforced composites", Chinese Journal of Aeronautics, 2014, pp. 1-14.

(56) References Cited

OTHER PUBLICATIONS

European Search Report for Application No. 224188681.1, mailed Dec. 4, 2024, 10 pages.
European Search Report for Application No. 24196227.3, mailed Oct. 31, 2024, 10 pages.
European Search Report for Application No. 24196233.1, mailed Oct. 31, 2024, 10 pages.
European Search Report for Application No. 24198989.6, mailed Nov. 4, 2024, 11 pages.
Doering et al., "Micromachined thermoelectrically driven cantilever structures for fluid jet deflection" [1992] Proceedings IEEE Micro Electro Mechanical Systems. IEEE, (Feb. 1992) pp. 12-18.
European Search Report for Application No. 24196295.0, mailed Jan. 29, 2025, 16 pages.
European Search Report for Application No. 24196309.9, mailed Jan. 28, 2025, 10 pages.
Jerman "Electrically-activated, micromachined diaphragm valves" IEEE 4th Technical Digest on Solid-State Sensor and Actuator Workshop, Hilton Head, SC, USA, (Jun. 1990) pp. 65-69.
Jerman et al., "Electrically activated normally closed diaphragm valves" Journal of Micromechanics and Microengineering 4.4 (Dec. 1994) pp. 210-216.
European Search Report for Application No. 24188696.9, mailed Dec. 16, 2024, 8 pages.
European Search Report for Application No. 24188713.2, mailed Jan. 2, 2025, 6 pages.
European Search Report for Application No. 24188714.0, mailed Dec. 13, 2024, 10 pages.
European Search Report for Application No. 24190738.5, mailed Jan. 13, 2025, 8 pages.
European Search Report for Application No. 24196219.0, mailed Jan. 13, 2025, 8 pages.
European Search Report for Application No. 24199038.1, mailed Jan. 31, 2025, 8 pages.
Partial European Search Report for Application No. 24196240.6, mailed Feb. 7, 2025, 16 pages.
Richardson,, "The aerospace secret standard", Apr. 12, 2019, Aerospace Manufacturing, www.aero-mag.com/the-aerospace-secret-standard; 8 pages.
Extended European Search Report for EP Application No. 24182403.6, dated Jun. 2, 2025, pp. 1-11.
Extended European Search Report for EP Application No. 24196240.6, dated Apr. 28, 2025, pp. 1-13.
Lazarus et al., "Direct electroless plating of conductive thermoplastics for selective metallization of 3D printed parts", Additive Manufacturing, vol. 55, Mar. 30, 2022, pp. 1-11.

* cited by examiner

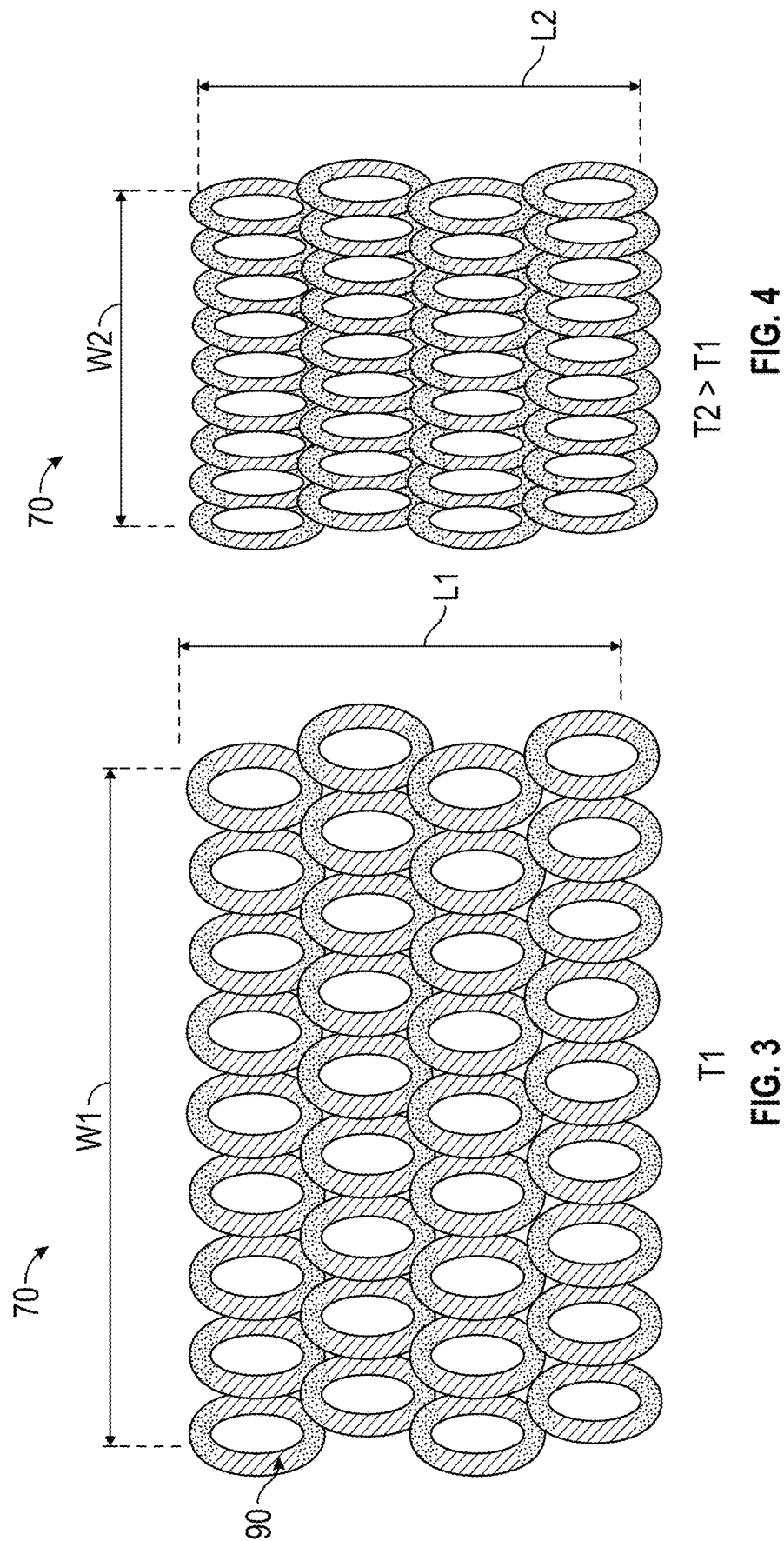

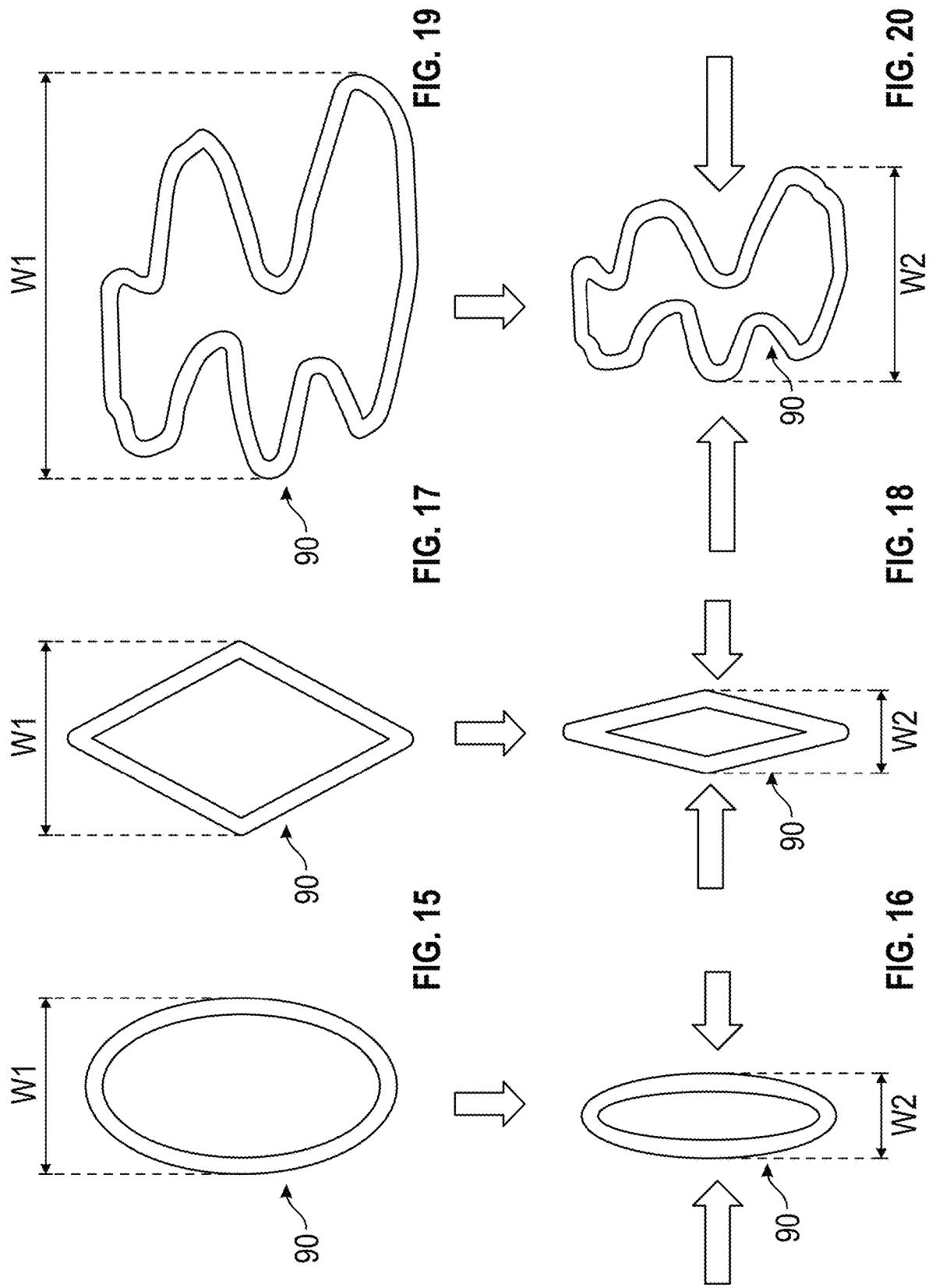

(T2 > T1)

AIRFOIL FORMED OF THERMALLY ADAPTIVE MATERIALS AND A THERMOELECTRIC JUNCTION

BACKGROUND

The embodiments are directed to an airfoil and more specifically to an airfoil formed of thermally adaptive materials and a thermoelectric junction.

Memory shape alloy or bimetallic parts may be utilized for various applications to avoid the requirement of utilizing complex machinery. However, working fluid temperatures may undesirably control the shape of the alloy.

BRIEF DESCRIPTION

Disclosed is an airfoil including: a composition gradient defining a first coefficient of thermal expansion and a second coefficient of thermal expansion that differs from the first coefficient of thermal expansion; and a thermoelectric junction operationally coupled to the composition gradient, wherein the composition gradient is formed of either of a plurality of dissimilar metals or of plastic with fillings or fibers.

In addition to one more aspects of the airfoil, or as an alternate, the airfoil includes a base formed by the composition gradient defining the first coefficient of thermal expansion and the second coefficient of thermal expansion that differs from the first coefficient of thermal expansion, so that: the base defines an outer boundary and beads within the outer boundary, each of the beads has a bead void, and each of the beads includes: first and second perimeter segments that are opposite each other and formed to define the first CTE; and third and fourth perimeter segments that are opposite each other, adjacent to the first and second perimeter segments, and formed to define the second CTE; and the thermoelectric junction is provided around the outer boundary or in one or more of the bead voids.

In addition to one more aspects of the airfoil, or as an alternate, each perimeter segment has a radial inner portion and a radial outer portion; the radial inner portion of the first and second perimeter segments is formed of to define the first CTE and the radial outer portion of the first and second perimeter segments is formed to define the second CTE; and the radial inner portion of the third and fourth perimeter segments is formed to define the second CTE and the radial outer portion of the third and fourth perimeter segments is formed to define of the first CTE.

In addition to one more aspects of the airfoil, or as an alternate, adjacent ones of the beads are interconnected to form a lattice.

In addition to one more aspects of the airfoil, or as an alternate, the outer boundary defines a first outer end and a second outer end, wherein the first and second outer ends are opposite each other, and the base includes a top elastomer layer that is disposed against the first outer end of the outer boundary and a bottom elastomer layer that is disposed against the second outer end of the outer boundary.

In addition to one more aspects of the airfoil, or as an alternate, the base includes an elastomer segment that extends from each of the beads that are located along the outer boundary of the base, so that adjacent ones of the elastomer segments overlap each other to define a flexible outer boundary cover.

In addition to one more aspects of the airfoil, or as an alternate, the base includes a support material that forms a support structure that defines the outer boundary of the base and a plurality of base voids, wherein each of the plurality of base voids is lined with one of the beads.

In addition to one more aspects of the airfoil, or as an alternate, the support material differs from the bead.

In addition to one more aspects of the airfoil, or as an alternate, the beads define an oval or diamond shape.

In addition to one more aspects of the airfoil, or as an alternate, the thermoelectric junction is a Peltier airfoil.

In addition to one more aspects of the airfoil, or as an alternate, the composition gradient is formed of a first material having the first CTE and a second materials having the second CTE, and one or both of the first and second materials is a bistable metal, alloy or composite.

In addition to one more aspects of the airfoil, or as an alternate, the airfoil includes a base defining a first CTE, and a second CTE that differs from the first CTE, wherein the base defines an outer boundary and extends in a first direction from first end to a second end and in a second direction from a first side to a second side, so that: a first layer extends in the first direction between the first and second ends to define the first CTE; a second layer extends in the first direction between the first and second ends to define the second CTE, wherein a layer junction is defined between the first and second layers; and a thermoelectric junction extends along the layer junction or the outer boundary.

In addition to one more aspects of the airfoil, or as an alternate, the base includes a chain of connected elements.

In addition to one more aspects of the airfoil, or as an alternate, the elements define an arcuate shape.

In addition to one more aspects of the airfoil, or as an alternate, one or both of the first and second layers are formed of first and second materials, one or both of which is a bistable metal, alloy or composite.

In addition to one more aspects of the airfoil, or as an alternate, the thermoelectric junction is a Peltier airfoil.

BRIEF DESCRIPTION OF THE DRAWINGS

The following descriptions should not be considered limiting in any way. With reference to the accompanying drawings, like elements are numbered alike:

FIG. 3 shows the lattice of beads in a normal state;

FIG. 4 shows the lattice of beads in a deformed state;

FIG. 15 shows an oval shaped bead, which may be utilized in the disclosed embodiments shown in FIGS. 2-10, in a normal state;

FIG. 16 shows the bead of FIG. 15 in a deformed state;

FIG. 17 shows a diamond shaped bead, which may be utilized in the disclosed embodiments shown in FIGS. 2-10, in a normal state;

FIG. 18 shows the bead of FIG. 17 in a deformed state;

FIG. 19 shows a random shaped bead, which may be utilized in the disclosed embodiments shown in FIGS. 2-10, in a normal state;

FIG. 20 shows the bead of FIG. 17 in a deformed state;

DETAILED DESCRIPTION

A detailed description of one or more embodiments of the disclosed apparatus and method are presented herein by way of exemplification and not limitation with reference to the Figures.

Figure 1A:
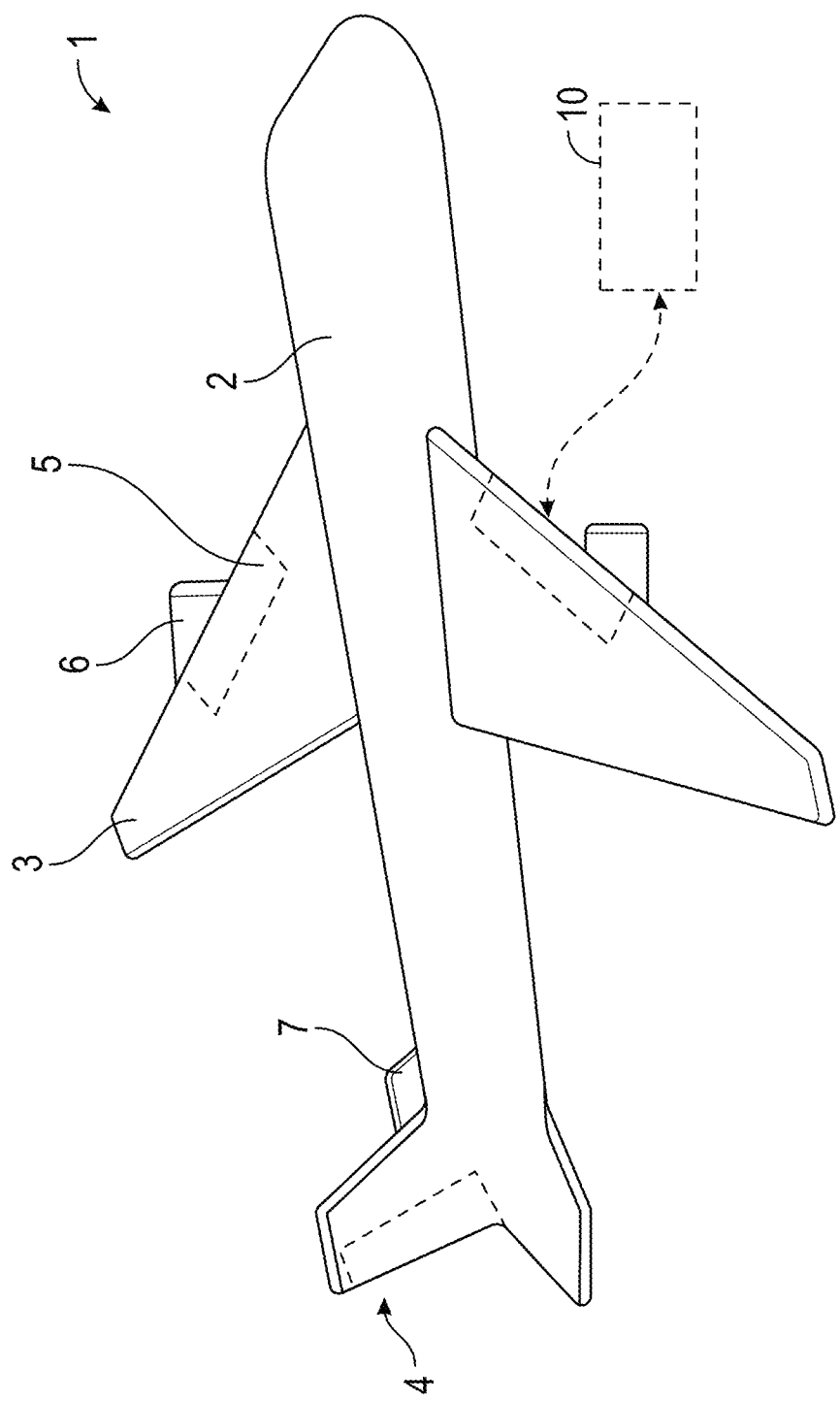
FIG. 1A shows an aircraft according to embodiment.
Figure 1B:
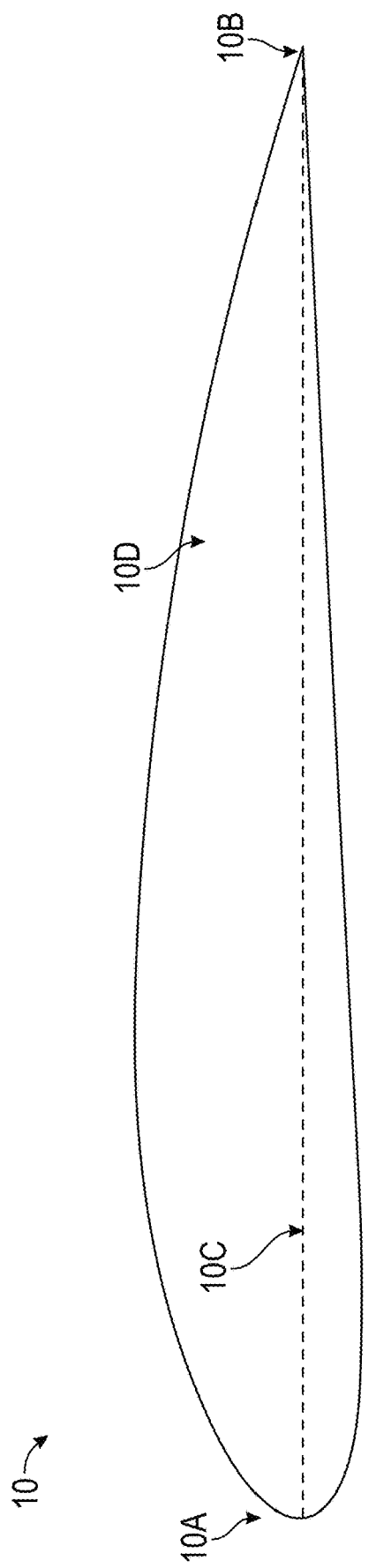
FIG. 1B shows an airfoil according to an embodiment, where the airfoil has a first camber profile.
Figure 1C:
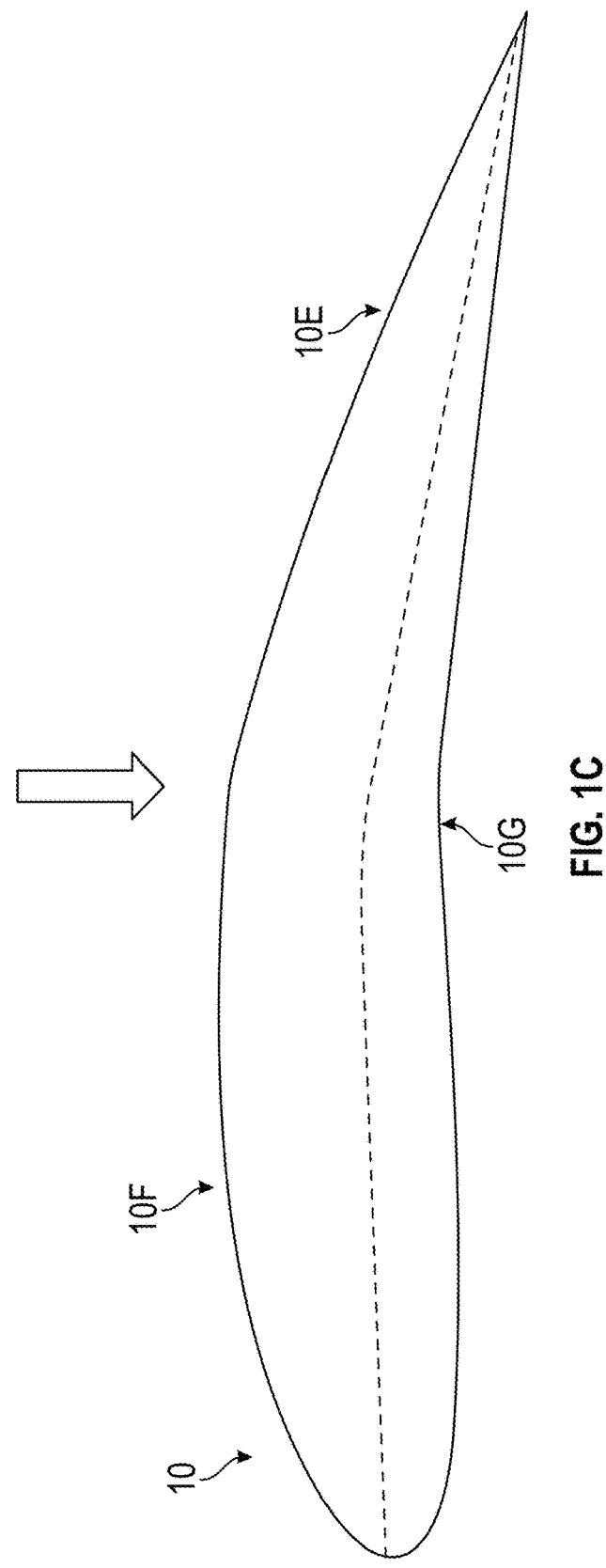
FIG. 1C shows the same airfoil of FIG. 1B with a second camber profile.

FIG. 1A shows an aircraft 1 having a fuselage 2 with a wing 3 and tail assembly 4, which may have control surfaces 5. The wing 3 may include an engine 6, such as a gas turbine engine, and an auxiliary power unit 7 may be disposed at the tail assembly 4. FIG. 1B shows an airfoil 10 of the aircraft 1 according to an embodiment. The airfoil 10 can be applied to fan blades, helicopter blades, rocket control surfaces, turbine blades, etc. The airfoil may have a leading edge 10A, a trailing edge 10B, a chord extending 10C between the leading and trailing edges 10A, 10B, and the airfoil skin 10D may define a first camber profile. FIG. 1C shows the same airfoil with a second camber profile, which is increased relative to the first camber profile, by pitching an aft portion 10E of the airfoil relative to a forward portion 10F. That is, a pitch region 10G is located at an intersection between the forward and aft portions 10F, 10E.

Figure 2:
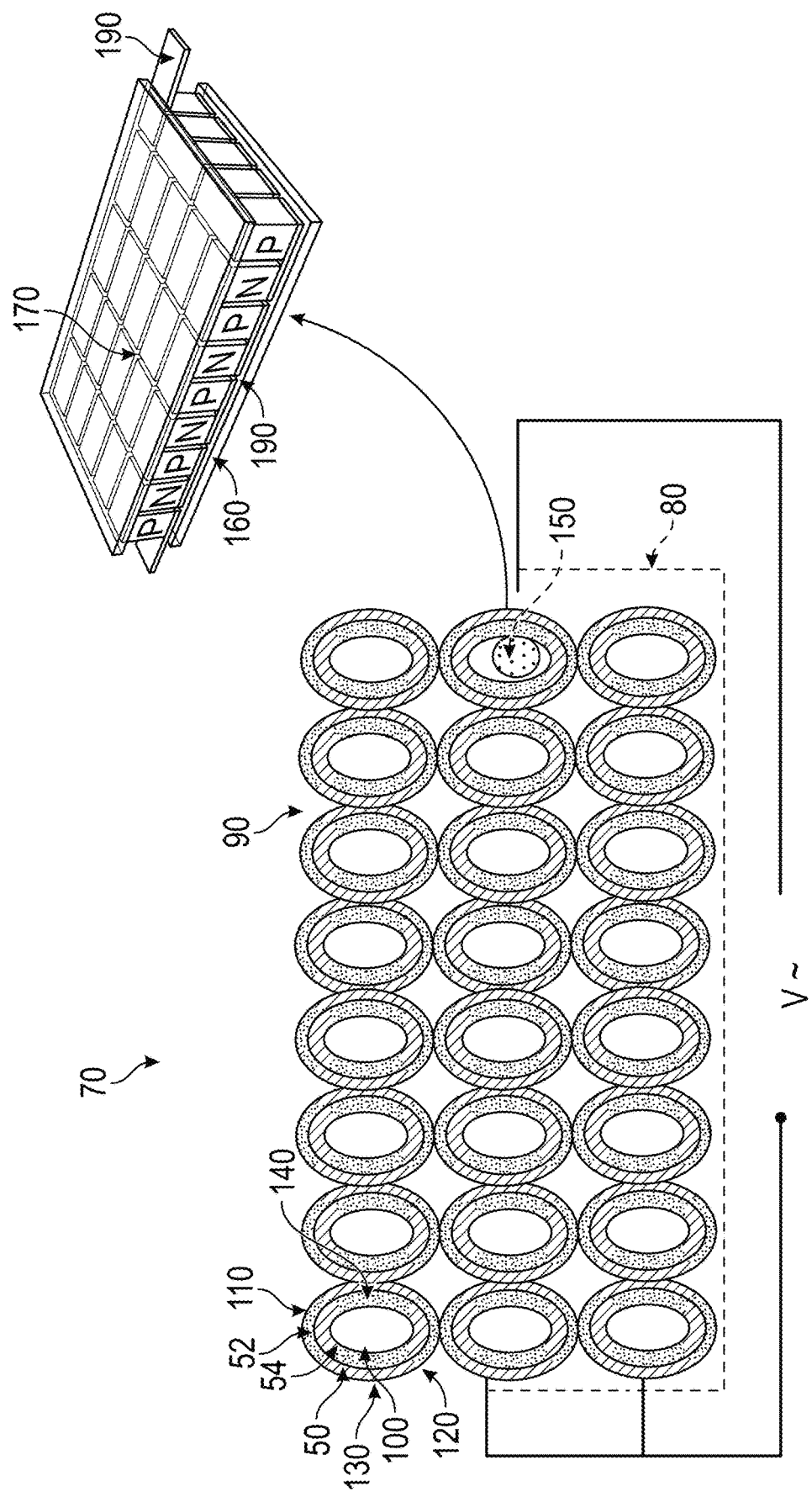
FIG. 2 shows a section of the airfoil, having a base formed of a lattice of beads utilizing composition gradients across the hoop-shaped walls, having inner and outer surfaces, to define perimeter segments along the walls of the beads, where the segments have different coefficients of thermal expansion (CTE) selected to provide a predetermined deformation, and where the lattice is formed with a thermoelectric junction.

In one embodiment, as shown in FIG. 2, the airfoil 10 may be additively manufactured with a base 70, utilized at least for the pitch region 10G of the airfoil of FIGS. 1A-1B, formed to have a composition gradients across the hoop-shaped walls 50, having an outer surface 52, an inner surface 54, to define first through fourth perimeter segments 110, 120, 130, 140 along the walls of the beads. The segments 110, 120, 130, 140 have different coefficients of thermal expansion (CTE) selected to provide a predetermined deformation. The lattice is formed with a thermoelectric junction. The composition gradient may be formed of a first material having a first coefficient of thermal expansion (CTE) and a second material having a second CTE that differs from the first CTE. The composition gradient may be formed by the utilization of different metals or may be formed by plastic, fillings or fibers. The base 70 may define an outer boundary 80 and a lattice of beads 90 within the boundary 80. The beads 90 may have an oval cross section, though such shape is not intended on limiting the scope of the embodiments.

Each of the beads 90 may have a bead void 100 or cavity and may include the first and second perimeter segments 110, 120 that are opposite each other. The beads 90 may include the third and fourth perimeter segments 130, 140 that are opposite each other, adjacent to the first and second perimeter segments 110, 120. With this configuration, each of the beads 90 forms a circumferential (or perimeter) CTE gradient.

Adjacent ones of the beads 90 may be interconnected with each other, e.g., along the perimeter segments 110-140. With this interconnected configuration, the beads 90 form the lattice.

A thermoelectric junction 150 may be disposed in one more of the bead voids 100, or may be disposed around the boundary 80 of the base 70. The thermoelectric junction 150 may form a Peltier or a Thomson device. For example, alternating P and N-type pillars made with materials with different Seebeck coefficients, or legs, are placed thermally in parallel to each other and electrically in series and joined with a thermally conducting plate on each side, e.g., ceramic, including a cooling plate 160 and a heating plate 170. When a voltage is applied to the free ends of the two semiconductors, via connections 190 there is a flow of DC current across the junction of the semiconductors, causing a temperature difference. The side with the cooling plate 160 absorbs heat which is then transported by the semiconductor to the other side of the device. One of the cooling plate 160 or heating plate 170 may be exposed to the atmosphere if desired to bleed energy from it rather than directing energy from it back to the airfoil 10.

The beads 90 may be formed of a bistable metal, alloy or composite. The beads 90 may be configured to change shape by a predetermined amount when subject to thermal input, e.g., heat, due to the second CTE obtained with the composition gradient. For example, when the beads 90 are subject to thermal input from the thermoelectric junction 150 (FIG. 2), shape of the base 70 may change from a first state (FIG. 3) to a second state (FIG. 4). In the first state, the base 70 may extend in a first direction (or length direction) to define a first length L1 and in a second direction (or width direction) to define a first width W1. In the second state the base 70 may extend in the first direction to define a second length L2 and in the second direction to define a second width W2. From the shape change, one of the first length and width L1, W1 may be greater or smaller than a corresponding one of the second length and width L2, W2. As shown in FIGS. 3 and 4, the first width W1 is greater than the second width W2 and the first and second lengths L1, L2 are the same as each other.

Figure 5:
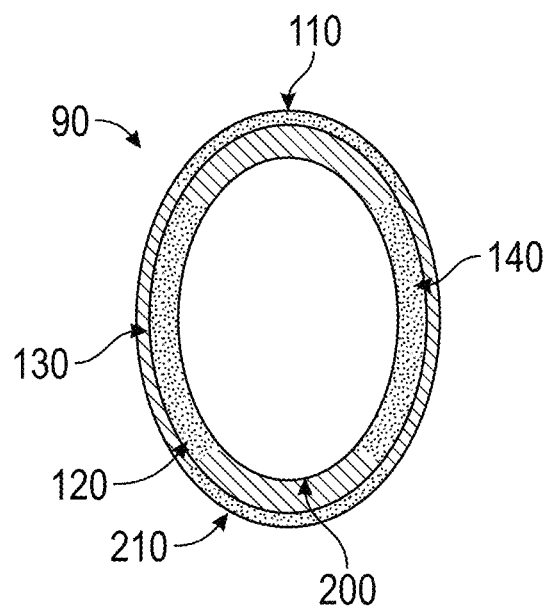
FIG. 5 shows an embodiment of a bead utilized in the configuration shown in FIGS. 2-4, where the bead is in a normal state.
Figure 6:
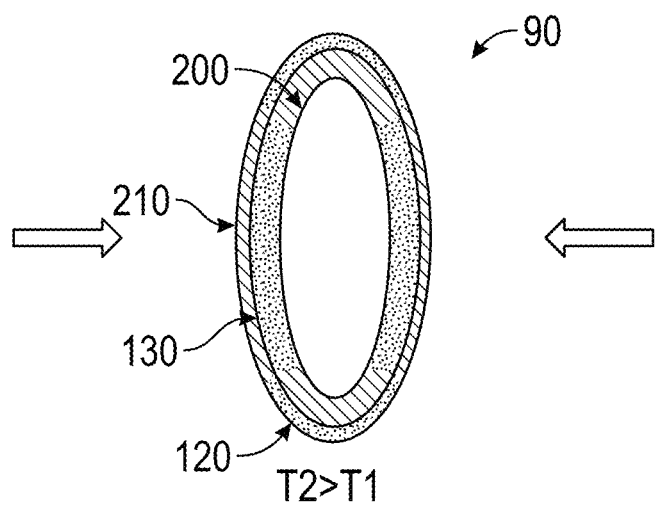
FIG. 6 shows the bead of FIG. 5 in a deformed state.

As shown in FIGS. 5 and 6, in one embodiment, each perimeter segment 110-140 may have a radial inner portion 200 (the above noted inner surface 54) and a radial outer portion 210 (the above noted outer surface 52). It is to be appreciated that the use of the term radial in this context does not require a circular cross section but rather references a distance from a center of the bead 90. The inner portion 200 of the first and second perimeter segments 110, 120 may be formed to have a first CTE and the outer portion 210 of the first and second perimeter segments 110, 120 may be formed to have a second CTE. As indicated, this may be obtained from different metals (e.g., first and second materials corresponding to first and second metals) or from plastic, fillings, or fibers. The inner portion 200 of the third and fourth perimeter segments 130, 140 may be formed to have the second CTE and the outer portion 210 of the third and fourth perimeter segments 130, 140 may be formed to have the first CTE. FIG. 5 shows the bead 90 in a first state when the thermoelectric junction 150 (FIG. 2) is not providing thermal input and FIG. 6 shows the bead in a second state when thermoelectric junction 150 is providing thermal input. The embodiment shown in FIGS. 5 and 6 provides a radial CTE gradient that results in a tailored deformation of the beads 90 upon receiving thermal input from the thermoelectric junction 150.

Figure 7:
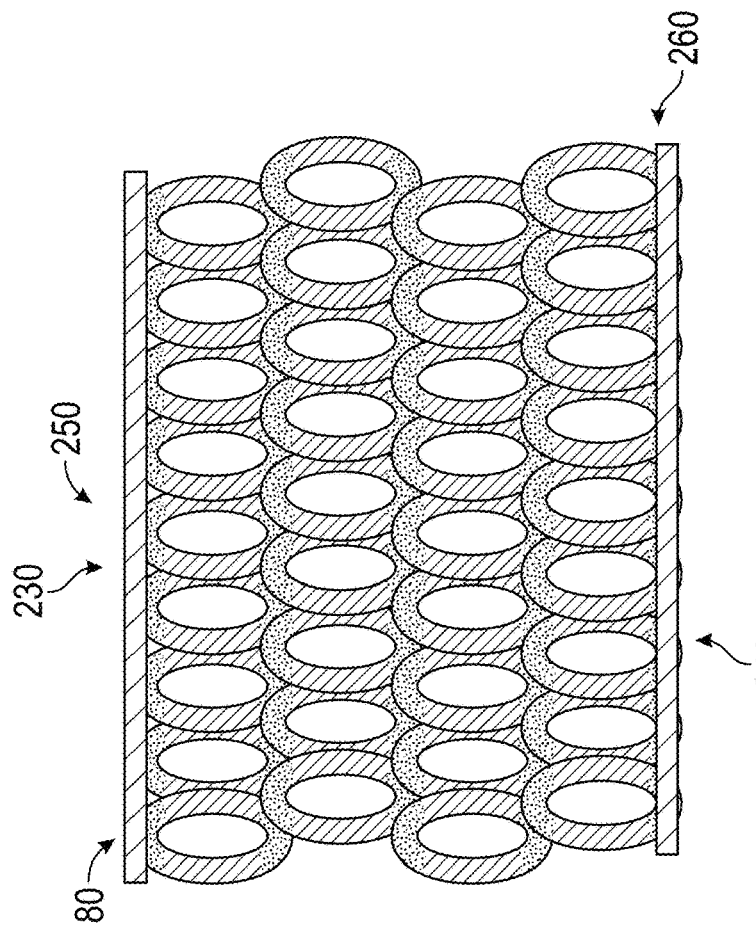
FIG. 7 shows the lattice of beads of FIG. 2 with top and bottom elastomer layers.

As shown in FIG. 7, the outer boundary 80 defines a first outer end 230 and a second outer end 240. The first and second outer ends 230, 240 are opposite each other. In one embodiment, a top elastomer layer 250 is disposed against the top end 230 of the outer boundary 80 and a bottom elastomer layer 260 is disposed against the bottom end 240 of the outer boundary 80.

Figure 8:
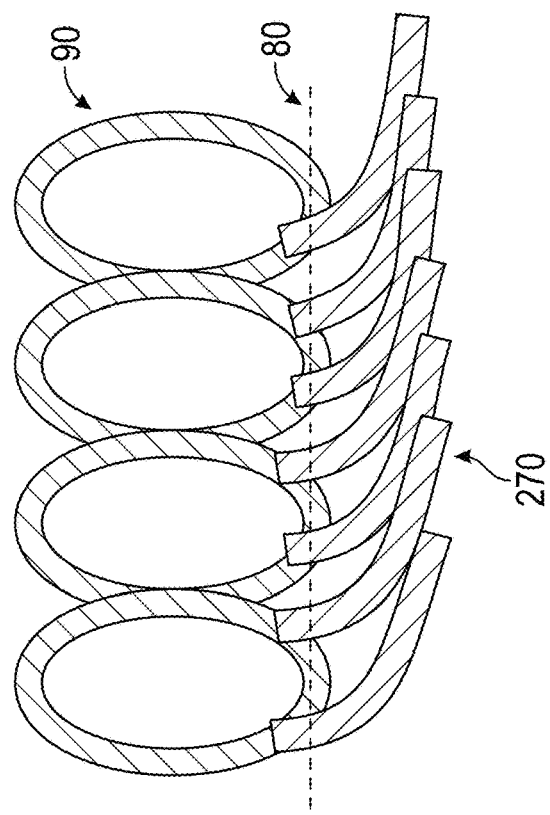
FIG. 8 shows a plurality of the beads, from the lattice of beads of FIG. 2, with an elastomer segment extending from each bead, over an adjacent bead, to form a continuous elastomer boundary.

As shown in FIG. 8, in one embodiment, an elastomer segment 270 extends from each of the beads 90 disposed at the outer boundary 80 of the lattice of beads 90. With this configuration, adjacent ones of the elastomer segments overlap each other to define a flexible outer boundary cover.

Figure 10:
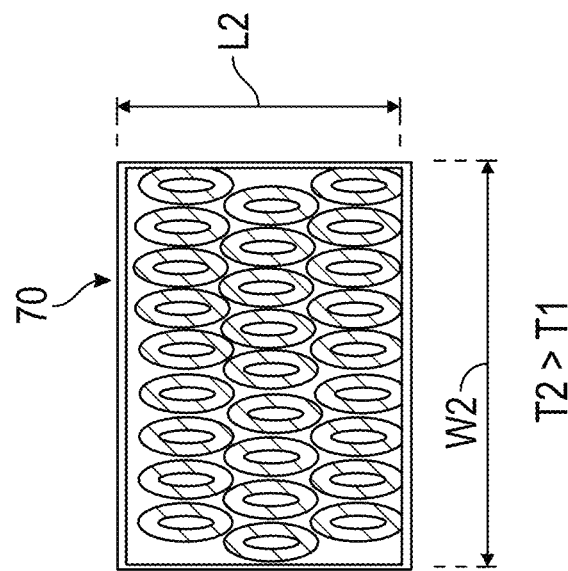
FIG. 10 shows the section of FIG. 9 in a deformed state.
Figure 9:
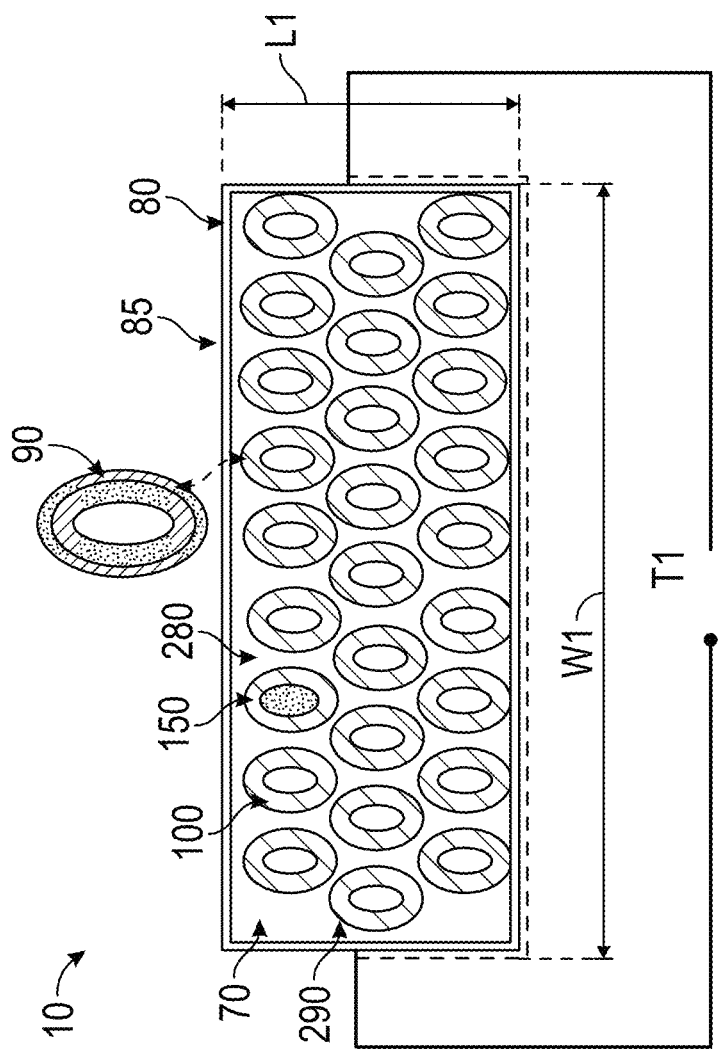
FIG. 9 shows an alternate configuration of the section of the airfoil, having a base that defines voids, where ones of the voids are lined with the beads shown in FIGS. 2-4, and a thermoelectric junction is formed either within at least one of the beads or around the base, and where the base is in a normal state.

Turning to FIGS. 9 and 10, in one embodiment, the base 70 of the airfoil 10 may be manufactured with a support structure 280 that may define the outer boundary 80 of the base 70 and internal base voids 290 or cavities. Each of the base voids 290 may be lined with one of above disclosed beads 90 and thus have a cavity surface 300 defining a cross sectional shape that is complementary to the shape of the beads 90. The support structure 280 may be formed of a support material that differs from the bead material. An exterior surface 85, surrounding the outer boundary 80 of the base 70, maybe be coated with the materials that form the bead 90. The support material may be an elastomer, a metal, an alloy or a composite. A thermoelectric junction 150 may be provided around the outer boundary 80 or in one or more of the bead voids 100.

FIGS. 9 and 10 show the base 70 in the first state, having a first length and width L1, W1, and the second state, having a second length and width L2, W2. As indicated above, from the shape change, one of the first length and width L1, W1 may be greater or smaller than a corresponding one of the second length and width L2, W2. In the illustrated embodiment, the second width W2 is smaller than the first width W1 and the first and second lengths L1, L2 are the same as each other.

Figures 11, 12:
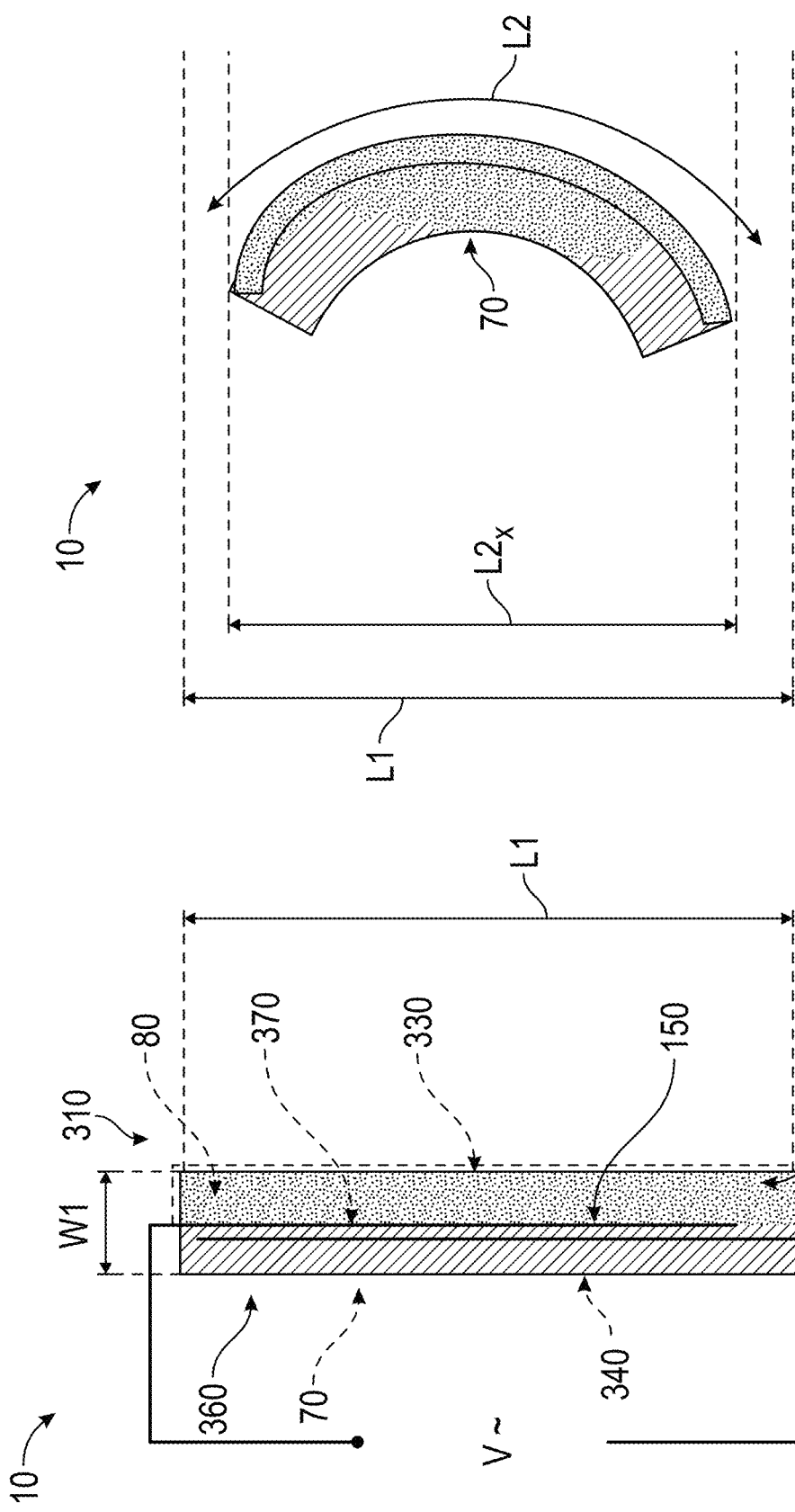
FIG. 11 shows another configuration of the section of the airfoil, having a base formed of a composition gradient defined by two material layers that extend alongside each other, where the two material layers have different CTEs selected to provide a predetermined deformation when subjected to heating, where a thermoelectric junction is formed between the two material layers, and where the section is in a normal state.
FIG. 12 shows the section of FIG. 11 in a deformed state.

FIGS. 11 and 12 show another embodiment in which the airfoil 10 may be additively manufactured to form a base 70 having a composition gradient. The composition gradient may define a first CTE, and a second CTE that differs from the first CTE. As indicated, this may be obtained from different metals (e.g., first and second materials corresponding to first and second metals) or from plastic, fillings, or fibers. The base 70 extends in a first direction (e.g., a length direction) from first end 310 to a second end 320 and in a second direction (e.g., a width direction) from a first side 330 to a second side 34. The base 70 defines an outer boundary 80. The first CTE may be formed from a first composition layer 350 that extends in the first direction between the first and second ends 310, 320, and in the second direction between the first side of the base 70 and a layer junction 370. The second CTE may be formed in a second composition layer 360 that extends in the first direction between the first and second ends 310, 320, and in the second direction between the second side 340 and the composition junction 370. That is, the first and second layers 350, 360 extend alongside each other. With this configuration, a transverse CTE gradient is formed in the base 70. A thermoelectric junction 150 may extend along the first direction at the layer junction 370, between the first and second composition layers 350, 360, or along the boundary 80 of the base 70.

The first and second composition layers each may be a bistable metal, alloy or composite. The base 70 may extend in the first direction by a first length L1 and in the second direction by a first width W1. Due to the different coefficients of thermal expansion, when subjected to thermal input by the thermoelectric junction 150, the base 70 may deform as shown in FIG. 11 to form an arcuate shape. When in the deformed state, a longer side of the base 70 may have a length L2 that is greater than the first length L1, though projected along first direction the base 70 has a second length L2x that is shorter than the first length L1. The width may be unchanged.

Figure 13:
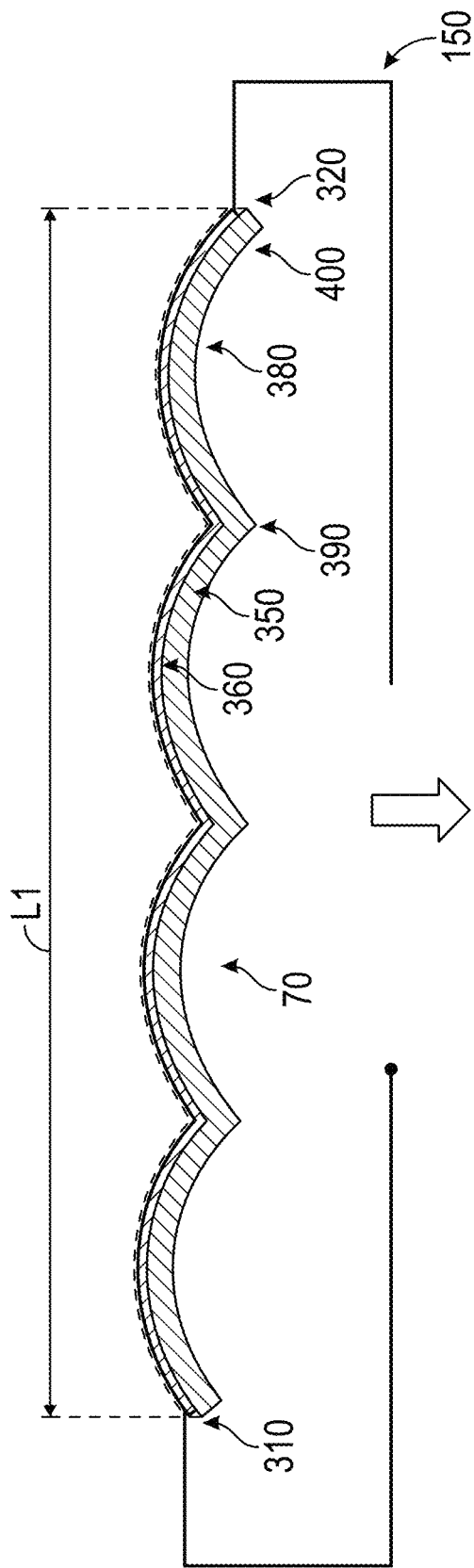
FIG. 13 shows an alternate configuration relative to the configuration of FIG. 11, where the composition gradient, formed of the two material layers, are formed of semicircular elements connected to one another, and where the section is in a normal state.
Figure 14:
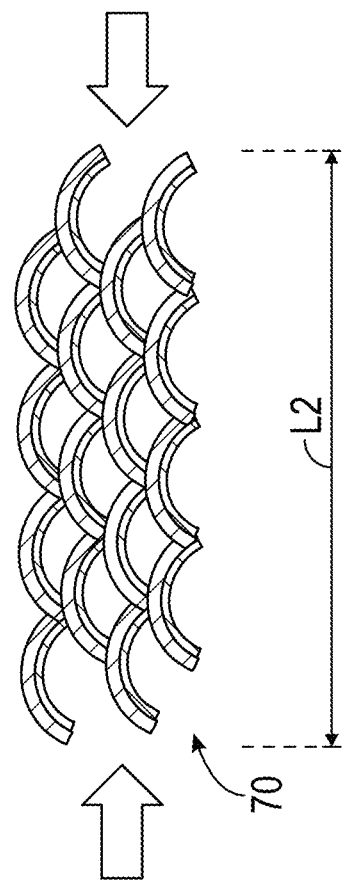
FIG. 14 shows the section of FIG. 13 in a deformed state.

As shown in FIGS. 13 and 14, between opposite ends 310, 320, in one embodiment the first and second layers form a chain of elements 380 connected at circumferential ends 390, 400. The elements 380 are illustrated as having a semicircular shape, though that is not intended on limiting the scope of the embodiments. FIG. 13 shows the base 70 is in a normal state, having a first length L1. FIG. 14 shows the base 70 in a deformed state, from thermal input from the thermoelectric junction 150, having a second length L2 which is smaller than the first length L1.

FIG. 15 shows an oval shaped bead 90, which may be formed as indicated above, in a normal state having a first width W1. FIG. 16 shows the oval bead 90 in a deformed state having a second width W2 that is less than the first width W1. As indicated, the beads 90 do not need to be arcuate in shape. FIG. 17 shows a diamond shaped bead 90 in a normal state having a first width W1. FIG. 18 shows the diamond shaped bead 90 in a deformed state having a second width W2 that is less than the first width W1. FIG. 19 shows a random shaped bead 90 in a normal state having a first width W1. FIG. 20 shows the random shaped bead 90 in a deformed state having a second width W2 that is less than the first width W1. The desired deformation shape may determine the shape of the bead 90.

Figure 21:
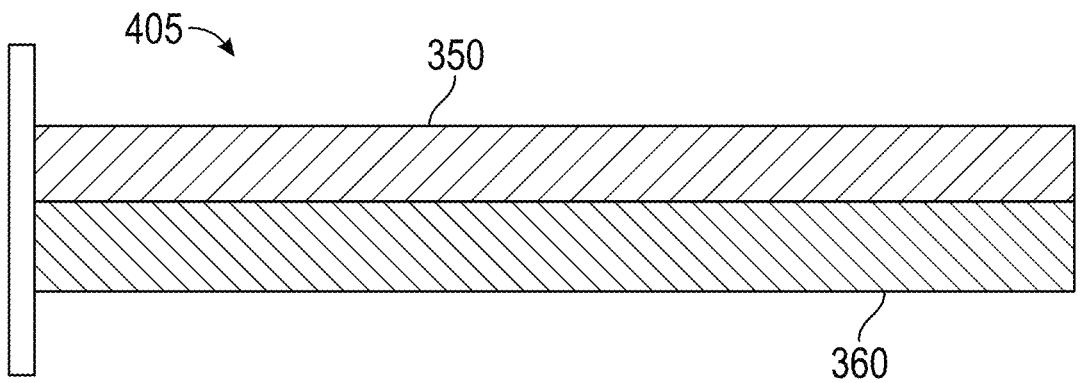
FIG. 21 shows an equivalent structure with a composition gradient formed of a plurality of materials having different coefficients of thermal expansion (CTE), at a temperature T1.
Figure 22:
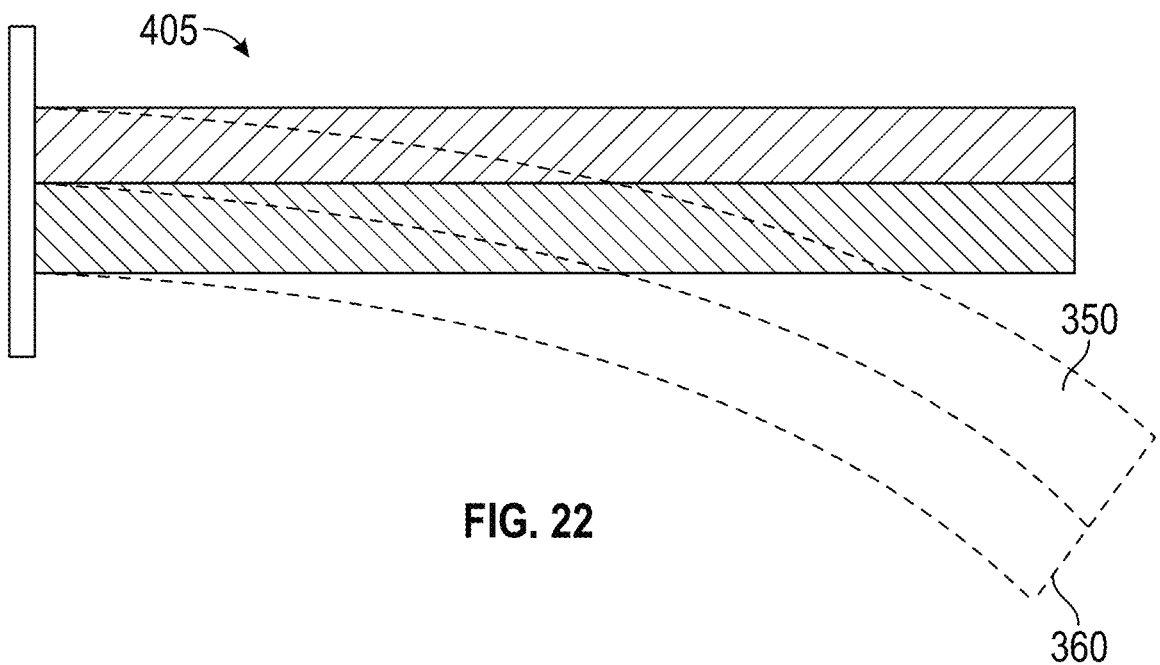
FIG. 22 shows the structure of FIG. 21 at a temperature T2>T1.

FIGS. 21 and 22 show an equivalent structure 405 to the structures shown above and for example in FIGS. 11-12. Specifically, the first and second composition layers 350, 360 are at a temperature T1 in FIG. 21, and T2 that is greater than T1 in FIG. 22. The controlled thermal expansion shown in FIG. 22 results from the composition layers being integrally connected. That is, the first and second composition layers 350, 360 bend together in a predictable and controlled way. That is, the controlled thermal expansion of the first and second composition layers 350, 360 in the disclose embodiments provides for controlled manipulation of the airfoil disclosed herein.

As can be appreciated, utilizing the above disclosed configurations to form the airfoil 10, the camber of the airfoil may be selectively increased or decreased to change flow characteristics around it, e.g., to modify lift and drag, by applying thermal input to the materials, e.g., along the outer boundary 80 of the base 70 or, within one or more of the bead voids 100. That is, driving current across the thermoelectric junction 150 in a first direction may increase camber and driving the current across the thermoelectric junction 150 in a second direction may decrease camber. Thus, a controllable airfoil may be obtained without the need for a movable part.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or airfoils, but do not preclude the presence or addition of one or more other features, integers, steps, operations, element airfoils, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An airfoil comprising:
a composition gradient defining a first coefficient of thermal expansion (CTE) and a second (CTE) that differs from the first coefficient of thermal expansion; and
a thermoelectric junction operationally coupled to the composition gradient,
wherein the composition gradient is formed of either of a plurality of dissimilar metals or of plastic with fillings or fibers;
a base formed by the composition gradient defining the first coefficient of thermal expansion and the second coefficient of thermal expansion that differs from the first coefficient of thermal expansion, so that:
the base defines an outer boundary and beads within the outer boundary,
each of the beads has a bead void, and each of the beads includes:
first and second perimeter segments that are opposite each other and formed to define the first CTE; and
third and fourth perimeter segments that are opposite each other, adjacent to the first and second perimeter segments, and formed to define the second CTE; and
the thermoelectric junction is provided around the outer boundary or in one or more of the bead voids.

2. The airfoil of claim 1, wherein:
each perimeter segment has a radial inner portion and a radial outer portion;
the radial inner portion of the first and second perimeter segments is formed to define the first CTE and the radial outer portion of the first and second perimeter segments is formed to define the second CTE; and
the radial inner portion of the third and fourth perimeter segments is formed to define the second CTE and the radial outer portion of the third and fourth perimeter segments is formed to define of the first CTE.

3. The airfoil of claim 1, wherein:
adjacent ones of the beads are interconnected to form a lattice.

4. The airfoil of claim 1, wherein:
the outer boundary defines a first outer end and a second outer end, wherein the first and second outer ends are opposite each other, and
the base includes a top elastomer layer that is disposed against the first outer end of the outer boundary and a bottom elastomer layer that is disposed against the second outer end of the outer boundary.

5. The airfoil of claim 1, wherein
the base includes an elastomer segment that extends from each of the beads that are located along the outer boundary of the base, so that adjacent ones of the elastomer segments overlap each other to define a flexible outer boundary cover.

6. The airfoil of claim 1, wherein:
the base includes a support material that forms a support structure that defines the outer boundary of the base and a plurality of base voids, wherein each of the plurality of base voids is lined with one of the beads.

7. The airfoil of claim 6, wherein:
the support material differs from the bead.

8. The airfoil of claim 1, wherein:
the beads define an oval or diamond shape.

9. The airfoil of claim 1, wherein:
the thermoelectric junction is a Peltier airfoil.

10. The airfoil of claim 1, wherein the composition gradient is formed of a first material having the first CTE and a second materials having the second CTE, and one or both of the first and second materials is a bistable metal, alloy or composite.

* * * * *